(12) United States Patent
Hopper et al.

(10) Patent No.: US 7,314,573 B2
(45) Date of Patent: Jan. 1, 2008

(54) PLATING PROCESS

(75) Inventors: Alan John Hopper, Manchester (GB); Mark Robert James, Manchester (GB)

(73) Assignee: Fujifilm Imaging Colorants Limited, Manchester (GB)

( * ) Notice: Subject to any disclaimer, the term of this patent is extended or adjusted under 35 U.S.C. 154(b) by 182 days.

(21) Appl. No.: 10/528,581

(22) PCT Filed: Aug. 22, 2003

(86) PCT No.: PCT/GB03/03679

§ 371 (c)(1),
(2), (4) Date: Oct. 28, 2005

(87) PCT Pub. No.: WO2004/028224

PCT Pub. Date: Apr. 1, 2004

(65) Prior Publication Data

US 2006/0049129 A1    Mar. 9, 2006

(30) Foreign Application Priority Data

Sep. 20, 2002 (GB) ................................ 0221891.5

(51) Int. Cl.
*H01B 13/00* (2006.01)
(52) U.S. Cl. .................................................. 216/13
(58) Field of Classification Search ................. 216/13; 522/160; 430/270.1
See application file for complete search history.

(56) References Cited

U.S. PATENT DOCUMENTS 4,270,985 A    6/1981    Lipson et al.
4,315,985 A *  2/1982    Castellani et al. .......... 430/314
5,270,368 A    12/1993   Lent et al.
5,721,007 A *  2/1998    Lynch et al. ............ 204/192.14

* cited by examiner

*Primary Examiner*—Roberts Culbert
(74) *Attorney, Agent, or Firm*—Morgan, Lewis & Bockius LLP

(57) ABSTRACT

A process for making an electronic device which comprises applying a non-aqueous plate-resistant ink by ink jet printing to selected areas of a dielectric substrate, optionally laminated with an electrically conductive metal(s), exposing the plate resistant ink to actinic and/or particle beam radiation to effect polymerisation, adding one or more metal layers by electrolytic or electroless deposition, the upper layer of which is an etch-resistant metal(s), removing the polymerised plate-resistant ink with alkali and finally removing the electrically conductive metal(s) which are optionally directly laminated to the dielectric substrate and not protected by an upper layer of etch-resistant metal(s) by chemical etching wherein the plate-resistant ink is substantially solvent-free and comprises:

A) 30 to 90 parts acrylate functional monomers free from acid groups comprising mono- or higher functionality wherein 5 to 95% by weight are mono-functional monomers;
B) 1 to 30 parts acrylate functional monomer containing one or more acid groups;
C) 0 to 20 parts polymer or prepolymer;
D) 0 to 20 parts radical initiator;
E) 0 to 5 parts colorant;
F) 0 to 5 parts surfactant; and where the ink has a viscosity of not greater than 30 cPs (mPa·s) at 40° C. and all parts are by weight.

17 Claims, No Drawings

PLATING PROCESS

The present invention relates to a plating process for making printed circuit boards which comprises applying to a dielectric substrate, optionally laminated with an electrically conductive metal, a plate-resistant acrylate ink by ink jet printer, polymerising the ink by exposure to actinic or particle beam radiation, adding a conductive plate metal(s) surface and removing the polymerised ink by chemical means. Where the dielectric substrate contains a laminated electrically conductive metal before applying the plate-resistant acrylate ink, such metal not protected by the plate metal(s) are removed by chemical etching.

Printed circuit boards are typically made by a complex process such as a dry film negative photo-resist process involving six or more discreet stages. Firstly, a dielectric substrate is laminated or coated with copper and the copper surface is then overlaid with a photo-resist layer. A photo-tool is prepared which is a negative of the required electrically conductive circuitry of the printed circuit and is often a silver photographic emulsion plate. The photo-tool is placed directly over the photo-resist layer and is then exposed to UV light. This causes the photo-resist layer to polymerise and harden in those areas exposed to the UV light to produce a latent negative image of the required electrically conductive circuitry in the photo-resist layer. The photo-resist layer is then chemically treated to remove the unexposed area of the photo-resist. This chemical treatment is typically mildly alkaline where the photo-resistant layer contains free carboxylic acid groups.

Further electrically conductive metal is then plated either electrolytically or by an electroless deposition process onto the exposed copper. This further metal may be optionally copper itself in order to increase the thickness of the final copper circuitry and/or it may be an upper layer of an etch-resistant electrically conductive metal(s). The polymerised photo-resist is then removed chemically by, for example, using stronger alkali where the photo-resist layer contains free carboxylic acid groups. Finally, the copper which is directly laminated to the dielectric substrate and not protected by the etch-resistant metal is removed by chemical etching.

Although the process is widely used in the manufacture of printed circuit boards (hereinafter PCB's) it is tedious, expensive and wasteful of materials since the photo-resist layer is made separately and applied over the total area of the copper/dielectric substrate laminate. Furthermore, the photo-tool containing the negative image of the desired electrically conductive circuitry is often distanced from the photo-resist layer so that diffraction of the UV light irradiation occurs leading to development and polymerisation in areas of the photo-resist not directly beneath the UV transparent areas of the photo-tool. This needs to be taken into consideration when preparing the photo-tool and can reduce the density and definition of the electrically conductive circuitry. Furthermore, the chemical structure of the photo-resist needs to be very carefully controlled since its removal both before and after exposure to UV light depends on an alkaline treatment. The density and integrity of the intended electrically conductive circuitry can be seriously compromised if either the unexposed photo-resist is incompletely removed or if some of the exposed and polymerised photo-resist is removed prior to chemically etching the copper.

Therefore there exists a significant attraction in applying a photo-resist to specific areas of a dielectric substrate which is optionally laminated with an electrically conductive metal(s) using ink jet printing technology since it removes the need for a photo-tool. The image, or negative image, is made digitally available direct from a computer, the number of processing steps is significantly reduced, the need for differential stripping of the photo-resist using different strengths of aqueous alkali is avoided and since there is no photo-tool which is distanced from the photo-resist layer there is the potential for improved definition and density of the circuitry. There also exists the cost saving in terms of photo-resist material since the photo-resist is only applied to those areas to be protected from chemical plating.

According to the invention there is provided a process for making an electronic device which comprises applying a non-aqueous plate-resistant ink by ink jet printing to selected areas of a dielectric substrate, optionally laminated with an electrically conductive metal(s), exposing the plate-resistant ink to actinic and/or particle beam radiation to effect polymerisation, adding one or more metal layers by electrolytic or electroless deposition, the upper metal layer of which is an etch-resistant metal(s), removing the polymerised plate-resistant ink with alkali and finally removing the electrically conductive metal(s) which is optionally directly laminated to the dielectric substrate and not protected by an upper layer of etch-resistant metal(s) by chemical etching wherein the plate-resistant ink is substantially solvent free and comprises the components:

A) 30 to 90 parts acrylate functional monomers free from acid groups comprising mono or higher functionality wherein 5-95% by weight is one or more mono-functional monomers;

B) 1 to 30 parts acrylate functional monomer containing one or more acid groups;

C) 0 to 20 parts polymer or prepolymer;

D) 0 to 20 parts radical initiators;

E) 0 to 5 parts colorant;

F) 0 to 5 parts surfactant; and wherein the ink has a viscosity of not greater than 30 cPs (mPa·s) at 40° C. and all parts are by weight.

As disclosed hereinbefore the plate-resistant ink is substantially free of organic solvents. By this is meant no additional solvents are required and only traces of solvents may be present as impurities or by-products in the manufacture of the various components used to make the ink. It is preferred that the ink contains not greater than 2 parts, more preferably not greater than 1 part and especially not greater than 0.5 parts organic solvent based on the total amount of the ink. It is much preferred that the plate-resistant ink is free from organic solvent.

The required viscosity of the plate-resistant ink is largely dependant on the particular print head employed and especially its temperature of operation. At present most suitable commercial print heads operate at a temperature from 25° C. to 65° C. Consequently, it is preferred that the viscosity of the plate-resistant ink is not greater than 30 cPs (mPa·s) at 40° C. Viscosity can be measured on any suitable equipment but is preferably measured using a Brookfield viscometer with a rotating spindle, for example a number 18 spindle. Preferably the viscosity is not greater than 20 and especially not greater than 15 cPs (mPa·s) at 40° C. It is also preferred that the viscosity is not less than 5 and especially not less than 8 cPs (mPa·s) at 40° C. Preferably the viscosity is from 8 to 15 cPs (mPa·s) at 40° C. Preferably the operating temperature of the print head is from 30 to 60° C. and especially from 35 to 45° C.

Preferably the ink jet printing is carried out using a Drop on Demand (DOD) peizo ink jet printer.

In one embodiment the number of parts of components A)+B)+C)+D)+E)+F)=100.

The term acrylate-functional as used hereinbefore means any monomer which contains the residue of a reactive vinyl group such as $CH_2=C(R)CO-$ where R is hydrogen, alkyl or cyano. When R is alkyl it is preferably $C_{1-6}$-alkyl. It is particularly preferred that the acrylate functionality is conferred by a methacryloyl or especially an acryloyl group. The monomers may have a relatively low molecular weight or they may be oligomer or polymeric in nature and may be of a molecular weight as high as 30,000. They are distinguished from the polymers or prepolymers which is component C) of the ink composition in that they are not polymers or prepolymers derived from the polymerisation of acrylate functional monomers. They may, however, be macromolecular and may contain hydrocarbyl groups linked by one or more heteroatoms as for example in polyethers, polyamides, urethanes, polyesters and ureas. The only limitation on the type and molecular size of the acrylate functional monomers is that they must be compatible, the one with the other, they must not form separate phases in the final plate-resistant ink, the etch-resistant ink must have the prescribed viscosity and the final ink after polymerisation must be removed by an alkali treatment. Typically, the acrylate functional monomers have a molecular weight below 30,000, more preferably not greater than 10,000, even more preferably not greater than 5,000 and especially not greater than 2,000 since this helps keep the viscosity of the plate-resistant ink within the prescribed limits. Specific examples of acrylate functional monomers free from acid groups are those which are commercially available under the Sartomer™, Actilane™ and Photomer™ trademarks such as Sartomer™ 506 (isobornyl acrylate), Sartomer™ 306 (tripropylene glycol diacrylate), Actilane™ 430 (trimethylol propane ethoxylate triacrylate), Actilane™ 251 (a tri-functional acrylate oligomer), Actilane™ 411 (a CTF acrylate), Photomer™ 4072 (trimethylol propane propoxylate triacrylate), Photomer™ 5429 (a polyester tetra acrylate) and Photomer™ 4039 (a phenol ethoxylate monoacrylate). Sartomer™, Actilane™ and Photomer™ are trademarks of Cray Valley Inc, Akros BV and Cognis Inc, respectively. Other examples of monomers are lauryl acrylate, isodecylacrylate, iso-octyl-acrylate, butyl acrylate, 2-hydroxy ethyl acrylate, 2-hydroxy propylacrylate, 2-ethyl hexyl acrylate, 1,6-hexanediol diacrylate, neopentyl glycol diacrylate, diethylene glycol diacrylate, butanediol diacrylate, trimethylolpropane triacrylate, pentaerythritol triacrylate, 1,3-butyleneglycol diacrylate, 1,4-butylene glycol diacrylate, triethylene glycol diacrylate, penta erythritol tetra acrylate, tripropylene glycol diacrylate, isobornyl acrylate, 2-norbornyl acrylate, cyclohexyl acrylate, phenoxyethyl acrylate and tetra hydrofurfuryl acrylate. Commercial samples of these acrylate functional monomers free from acid groups may in practice contain traces of acidic impurities, in which case the number of parts of acrylate functional monomers free from acid groups is taken as that part of the sample which has no acid groups, i.e. excluding any part that does have acid groups. It is preferred that the amount of monofunctional acrylate monomer is 15-95%, more preferably not less than 40-95%, especially 60-95% and more especially not less than 70-95% by weight relative to the total weight of component A). The acid group of the acrylate functional monomer containing one or more acid groups which is component B) is preferably sulphate, phosphate or especially carboxylic acid. It is particularly preferred that the acrylate functional monomer containing one or more acid groups contains only one acid group. This acid group enables the plate-resistant printing ink to be removed from the dielectric substrate or electrically conductive metal or alloy, such as copper, of the electronic device under alkaline conditions. The acid group also promotes adhesion with the conductive metal such as copper and consequently the presence of other specific metal adhesion promoters in the ink formulation are not essential. Preferably the acid group (s) is located in a mono-functional acrylate monomer. Examples of acrylate functional monomers having one or more acid groups are acrylic acid, methacrylic acid, 2-carboxylethyl acrylate, 2-acetamido acrylic acid, mono-2-(acryloyloxy) ethyl succinate, 2,2-bis(acryloylamide) acetic acid, bis (2-(methacryloyloxy)ethyl phosphate, bis(3-sulphopropyl) itaconic acid, ethylene glycol methacrylate, itaconic acid, mono-2-(methacryloyloxy) ethyl phosphate, mono-2-(methacryloyloxy) ethyl succinate, 2-(sulphoxy) ethyl methacrylic acid, 2-acrylamido-2-methyl-1-propane sulphonic acid, 3-sulphopropyl acrylic acid, mono-2-(methacryloyoxy) ethyl phthalate, 3-sulphopropyl methacrylic acid, maleic acid, fumaric acid and mono-2-(acryloyloxy) ethyl phthalate. Acrylic acid, methacrylic acid and 2-carboxy ethylacrylate are much preferred as the acid group containing acrylate functional monomer, e.g. (meth)acrylic acid.

The amount of acrylate functional monomer containing one or more acid groups represented by component B) is preferably not greater than 20 parts, more preferably not greater than 15 parts and especially not greater than 10 parts by weight. It is preferred that the amount of acrylate functional monomer containing one or more acid groups represented by component B) is not less than 3 parts and especially not less than 5 parts by weight. Useful effects have been achieved wherein the amount of acrylate functional monomer containing one or more acid groups is from 5 parts to 15 parts by weight.

The precise chemical structure of many carboxylic acid-containing monomers is unknown but from their description they do contain one or more carboxylic acid moieties. Many are obtained from diols and polyols which are esterified by reaction with (meth)acrylate acid and consequently, or deliberately, contain free (meth)acrylic acid. The free (meth) acrylic acid may be the only component of the commercially available acrylate functional monomer which contains a carboxylic acid moiety. Nevertheless, for the purpose of this invention such commercial mixtures containing free (meth) acrylic acid are regarded as single compounds regarding acid values.

Preferred acrylate functional monomer containing one or more acid groups represented by component B) have an acid value of not less than 10 mg KOH/g, more preferably not less than 20, even more preferably not less than 100 mg KOH/g and especially not less than 200 mg KOH/g.

As noted hereinbefore, the plate-resistant ink must be readily removed under alkaline conditions after chemical etching of the metal. Consequently, it is preferred that the total etch resistant ink should have an acid value of greater than 30, more preferably greater than 40, and especially greater than 50 mg KOH/g. Although inks having an acid value above 150 mg KOH/g may be used, there is generally no advantage in such levels.

The plate-resistant inks may be removed under alkaline conditions which may be aqueous or solvent based. Solvent based media generally contain organic amines, especially alkanolamines such as ethanolamine. Preferred organic solvents are polar in nature since this aids their removal in subsequent aqueous rinsing. However, it is much preferred to use aqueous alkaline media, typically alkali metal hydroxides, carbonates and bicarbonates.

The polymer or prepolymer which is component C) may be any polymeric material which is compatible with the acrylic functional monomers represented by components A) and B). It is distinguished from the acrylate functional monomers represented by components A) and B) in that it is devoid of acrylate functionality and/or is derived from polymerising one or two acrylate functional monomers. The polymer or prepolymer typically has a number average molecular weight of from 500 to about 100,000, Preferably the molecular weight is not greater than 30,000 and especially not greater than 10,000. It is also preferred that the molecular weight is not less than 700 and especially not less than 1,000. The polymeric material may belong to any class of resin such as polyurethane, polyester, polyimide, polyamide, epoxy, silicone-containing resin or fluorinated resin materials, including mixtures thereof. The prepolymer or polymer may react with one or more of the acrylate functional monomers represented by components A) and B) or it may intercolate with the acrylate polymer formed by components A) and B). Although it is not a prerequisite that the polymer or prepolymer represented by component C) exhibits aqueous alkali solubility this is much preferred since it aids removal of the final etch-resistance ink after the electrically conductive circuitry is produced. In some instances where the polymer or prepolymer reacts with or strongly intercolates with the polymer formed by the acrylate-functional monomers represented by components A) and B) aqueous alkali solubility of the polymer or prepolymer represented by component C) is unnecessary.

It is preferred that the amount of component C) when present is not greater than 10 parts, more preferably not greater than 5 parts and especially not greater than 3 parts by weight of the total amount of the plate-resistant ink. It is especially preferred that the ink contains no component C).

The radical initiator represented by component D) may be any initiator including optional synergists which are commonly used in the trade to initiate polymerisation of acrylate functional monomers. The initiator and synergist, when present may be activated by actinic radiation such as UV radiation or by accelerated particles as, for example; in electron beam radiation. Suitable sources of actinic radiation include mercury lamps, xenon lamps, carbon arc lamps, tungsten filament lamps, lasers, electron beam and sunlight. Ultraviolet (UV) radiation is preferred especially that emitted by medium pressure mercury lamps. Thus the radical initiator is optionally a photo initiator activated by UV light Examples of suitable radical initiators and synergists are anthraquinone, substituted anthraquinones such as alkyl and halogen substituted anthraquinones such as 2-tert butyl anthraquinone, 1-chloroanthraquinone, p-chloroanthraquinone, 2-methylanthraquinone, 2-ethylanthraquinone octamethyl anthraquinone and 2-amylanthraquinone, optionally substituted polynuclear quinones such as 1,4-naphthoquinone, 9,10-phenanthraquinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, 3-chloro-2-methylanthraquinone, retenequinone, 7,8,9,10-tetrahydronapthaanthraquinone, 1,2,3,4-tetrahydro benzanthracene-7.2-dione, acetophenones such as acetophenone, 2,2-dimethyoxy-2-phenyl acetophenone, 2,2-diethoxy-2-phenyl acetophenone, 1,1-dichloro acetophenone, 1-hydroxy cyclohexyl-phenylketone and 2-methyl-1-(4-methylthio)phenyl-2-morpholin-propan-1-one; thioxanthones such as 2-methylthioxanthone, 2-decylthioxanthone, 2-dodecylthioxanthone, 2-isopropylthioxanthone, 2,4-dimethylthioxanthone, 2,4-diethylthioxanthone, 2-chlorothioxanthone and 2,4-diisopropylthioxanthone; ketals such as acetophenone dimethylketal and dibenzylketal; benzoins and benzoin alkyl ethers such as benzoin, benzyl benzoin methyl ether, benzoin isopropyl ether and benzoin isobutyl ether; azo compounds such as azobisisovaleronitrile; benzophenones such as benzophenone, methylbenzophenone, 4,4¹-dichlorobenzophenone, 4,4¹-bis-diethyl amino benzophenone, Michler's ketone and xanthone, including mixtures thereof. Important commercial initiators and synergists are Speedcure™ ITX, EHA and 3040. Irgacure™ 184,369, 907 and 1850 are Daracure™ 1173, Speedcure™, Irgacure™ and Daracure™ are registered trademarks of Lambson Plc and Ciba GmbH, respectively.

The amount of radical initiator and synergist is preferably not greater than 20 parts, more preferably not greater than 15 parts and especially not greater than 10 parts based on the total amount of the plate-resistant ink. It is also preferred that the amount of radical initiator is not less than 0.1 part.

It may be preferred to make the ink available in a two-pack composition in order to improve stability under storage. In a preferred two-pack composition, the radical initiator (component D) and carboxy containing acrylate (component B) are separated. In a particularly preferred two-pack composition, the initiator is made available in a formulation together with either some or all of the acrylate functional monomers which constitute component (A), especially the mono-functional acrylate monomers.

The colorant which is component E) of the plate-resistant ink jet composition is preferably a pigment and may be organic or inorganic including those pigments with surface modification which facilitates self dispersion in the ink. The pigment may be from any of the recognised classes of pigments described, for example, in the Third Edition of the Colour Index (1971) and subsequent revisions of and supplements thereto under the chapter headed "Pigments". Examples of inorganic pigments are titanium dioxide, Prussian blue, cadmium sulphide, iron oxides, vermillion, ultramarine and the chrome pigments, including chromates, molybates and mixed chromates and sulphates of lead, zinc, barium, calcium and mixtures and modifications thereof which are commercially available as greenish-yellow to red pigments under the names primrose, lemon, middle, orange, scarlet and red chromes. Examples of organic pigments are those from the azo, diazo, condensed azo, thioindigo, indanthrone, isoindanthrone, anthanthrone, anthraquinone, isodibenzathrone, triphendioxazine, quinacridone and phthalocyanine series, especially copper phthalocyanine and its nuclear halogenated derivatives, and also lakes of acid, basic and mordent dyes. Carbon black, although strictly inorganic, behaves more like an organic pigment in its dispersing properties. Preferred organic pigments are phthalocyanines, especially copper phthalocyanines, monoazos, diazos, indanthrones, anthanthrones, quinacridones and carbon blacks.

As noted hereinbefore, the plate-resistant ink jet composition is of use in the manufacture of electrical devices comprising a dielectric substrate and a coating of a conductive layer such as PCB's. In this industrial sector the preferred colour is blue or green and hence the pigment is preferably one of the phthalocyanine series. Examples of blue pigments are C.I. Pigment Blue 1, 15, 15:1, 15:2, 15:3, 15:4, 15:6, 16, 24 and 60. Green pigments are generally a mixture of blue and yellow or orange pigments or it may be a green pigment per se such as halogenated metal phthalocyanine for example copper or a nickel brominated phthalocyanine.

The pigment is typically incorporated into the plate-resistant ink jet composition by milling it together with one or more of the acrylate functional monomers in the presence of a dispersant. The dispersant is preferably a polyester/polyamine and is, for example, a dispersant as disclosed in U.S. Pat. No. 6,197,877. Dispersants of this type are available under the trademark Solsperse™ dispersants (Avecia Ltd). The dispersant may also include a synergist such as a quaternary ammonium salt of a partially sulphonated copper phthalocyanine pigment. Examples of such synergists are disclosed in GB-A-1508576, GB-A-2108143 and WO 01/14479 and are available under the Solsperse™ trademark.

The ratio of dispersant to synergist is typically from 1:1 to 10:1 by weight and is preferably about 5:1 by weight. The total amount of dispersant and synergist to pigment may vary over wide limits and is typically from 50% to 150% by weight relative to the weight of colorant. The amount of colorant in the plate-resistant ink is preferably not greater than 5 parts, more preferably not greater than 3 parts and especially not greater than 2 parts by weight.

The surfactant which is component F) of the plate-resistant ink composition when present may be any surface-active material which aids the homogeneity of the ink composition and provides desirable surface tension and wetting properties to the resultant ink. The surfactant may also be selected to adjust the viscosity of the ink composition to the desired limits. It is preferably anionic or especially non-inonic and is preferably aliphatic in nature, optionally containing silicon atoms and/or fluorine.

The surfactant is preferably reactive with the acrylate monomers (component A)) and it is especially preferred that it contains one or more (meth)acrylate functional groups as defined hereinbefore. Examples of organic silicon acrylate surfactants are polysilicones containing repeat units of formula —Si($R^1$, $R^1$)—O. Where $R^1$ is monovalent hydrocarbyl which may be alkyl or aryl and also at least one group of formula —Si(—X—$R^1$—O—) where X is a (meth) acrylate moiety. Specific examples are Tegorad™ 2200N and 2100 of Tego Chemie.

The plate-resistant ink preferably has a surface tension of from 20 to 40 and especially between 25 and 35 mN/m. Consequently, the amount of surfactant is generally from 0.1 to 0.6 parts by weight.

The plate-resistant ink may further contain other adjuvants which are commonly used in radiation or particle beam curable compositions. Such adjuvants include slip modifiers, thixotropic agents, foaming agents, anti-foaming agents, waxes, oils, plasticisers, binders, antioxidants, photo initiator stabilisers, gloss agents, fungicides, bactericides, organic and/or inorganic filler particles, levelling agents, opacifiers, antistatic agents and metal adhesion promoters.

The plate resistant ink may be exposed to actinic radiation and/or particle beam radiation at any convenient time after the ink is expressed from an ink jet printing nozzle of a print head and includes in-flight-and post-flight exposure of the ink.

The metal circuitry of the electronic device may be any metal or alloy which is conventionally used for such devices and includes gold, nickel/gold, nickel, tin, tin/lead, aluminium, silver, palladium, tin/aluminium and especially copper.

The dielectric substrate of the electronic device may be any non-conductive material but is typically paper/resin composite, resin/fibre glass composite, ceramic, polyester or polyimide (e.g. Kapton of DuPont Inc).

As noted hereinbefore, the plate-resistant ink may be applied by ink jet printing to a dielectric substrate optionally laminated with an electrically conductive metal(s). The metal(s) may be in the form of a continuous sheet or in the form of a pre-existing electrical circuit. Preferably, the electrically conductive metal is in the form of a continuous sheet and is preferably copper.

When the dielectric substrate is not laminated with an electrically conductive metal the metal plating layer can only be deposited using an electroless process. The electroless deposition process is generally preceded by treating the dielectric substrate with palladium, palladium/tin or nickel in aqueous acid media or with colloidal palladium sulphides. This pre-treatment provides for better adhesion of the plating metal(s).

The electroless deposition is general effected by immersing or spraying the dielectric substrate with an aqueous alkaline solution of the required metal in the presence of an aldeyhyde, such as formaldehyde. In the case of copper a typical aqueous liquour contains 3 gm/litre copper sulphate, 6-9 gm/litre formaldehyde and 6-9 gm/litre sodium hydroxide. Typical temperatures are between 20 and 60° C. for up to 60 mins although 30 mins at 25° C. is adequate.

The electroless process tends to deposit the metal plating layer in a rather granular form and hence it is much preferred to add the metal layer(s) by an electrolytic process. However, such a process can only be used when the dielectric substrate already contains a surface layer of electrically conductive metal and this then forms the cathode in the electrolytic process. Electrolytic plating is typically effected from an aqueous acid bath containing the metal(s) to be plated at a temperature from 20 to 60° C. Examples of electrolytic plating baths are 75 gm/litre copper sulphate with 200 gm/litre sulphuric acid; 300 gm/litre nickel sulphate, 60 gm/litre nickel metal, 40 gm/litre nickel chloride and 40 gm/litre boric acid; 1 troy ounce/gallon potassium gold cyanide at pH 3.5 to 5.0.

The layer of plated metal(s) is preferred not greater than 80, more preferably not greater than 50 and especially not greater than 20 microns thick.

Preferably the plating metal is copper, tin, tin/lead, silver, palladium, nickel and gold. When the plating metal is copper this may be used to increase the thickness of a pre-existing layer of copper or copper circuitry in the dielectric substrate. When the plating metal is tin, tin/lead, solver, palladium, nickel or gold this is often used over a copper circuitry to protect the copper from the environment and/or to improve electrical contacts. A nickel layer is often used between copper and gold in order to inhibit migration of the gold into the copper layer.

The dielectric substrate containing electrically conductive metal circuitry may be finally treated with a solder mask ink.

The plate-resistant ink may be prepared by any method known to the art of actinic radiation or particle beam curable compositions. Typically, the components A) and B) are mixed together with rapid stirring at a temperature from 20 to 60° C., preferably under reduced light conditions until a homogenous solution is obtained. Component D) is then added and stirring continued at 20 to 60° C. under reduced light conditions. Finally, optional components C), E) and F) are added.

As noted hereinbefore component E) is preferably a pigment, especially a blue or green pigment and is preferably prepared by any suitable attrition process such as grinding, pebble or bead milling the pigment together with dispersant in the presence of small amounts of component A) and/or component B). When component E) is a pigment it is added to the other components of the ink in a pre-dispersed form.

The ink composition is then preferably filtered at 20 to 25° C. to remove any particulate matter. Filtration also includes a process known as cascade filtration when the ink composition passes through successively finer filter media, for example, 10, 6, 4.5, 2.5 and 1.2 micron filters.

The chemical etching may be carried out by any means appropriate to the metal or alloy concerned. When the conductive metal is copper, etching is preferably carried out using aqueous acid copper (II) chloride, aqueous ammoniacal copper (II) complex and aqueous ferric chloride optionally containing hydrochloric acid.

Etching is typically carried out at a temperature from 20 to 100° C. although it is preferably between 25 and 60° C. and includes spraying or dipping where the laminate may be contacted with the chemical etchant when in either the horizontal or vertical position.

Spraying is preferred, especially where the laminate is in the vertical position since this allows for quicker removal of the chemical etchant containing removed metal and/or alloy. The speed of etching may be accelerated b agitating the chemical etchant, for example, using sonic agitation.

Laminates comprising a dielectric substrate and an electrically conductive circuitry made using the plate-resistant ink of the invention may be used singly or in combination in printed circuit boards (PCB's) in the manufacture of electronic devices.

The invention is further illustrated by the following non-limiting examples wherein all references are to parts by weight unless expressed to the contrary.

EXAMPLE 1

Sartomer™ 506 (57.04 parts), Sartomer™ 306 (12.92 parts), Actilane™ 430 (5.60 parts), Actilane™ 251 (5.60 parts) and acrylic acid (5.0 parts) were stirred together at 25° C. for 1 hour to give a homogeneous solution. The photo initiators Speedcure™ EHA (4.0 parts), Speedcure™ ITX (2.0 parts) and Irgacure™ 369 (4.0 parts) where then added and the ink composition was stirred at 60° C. under reduced light conditions to dissolve the photo-initiators.

A pre-milled dispersion of Irgalite™ Blue GLVO (2.0 parts) with Solsperse™ 32000/5000 (1.44 parts) in a small amount of the above monomers was added. The resulting plate-resistant ink was then filtered through a series of millipore filters with pore sizes of 10, 6, 4.5, 2.5 and 1.2μ in a cascade process in order to remove particulate matter.

The plate-resistant ink had a viscosity of 9.5 cP (mPa·s) at 40° C. as determined by Brookfield Viscometer fitted with a number 18 spindle rotating at 100 rpm. The surface tension at 20° C. was 28.0 mN/m as determined by Nouy ring. The basic ink jetting start-up and firing was good using a Xaar XJ500/360 print head.

The plate-resistant ink was coated to a thickness of 25 μm and also lines of ink were ink jet printed to a thickness of 30 μm onto a glass fibre/resin dielectric (FR4) board laminated with 30 μm copper sheet. The ink was then polymerised by UV radiation of 300-900 mJ/cm (2.8-3.6 W/cm$^2$ at a pass speed of 10-35 m/min) provided by a "Fusion D bulb" running at 120 W/cm.

After curing, the pencil hardness was 2H as determined using test method TM 2.4.27.2 of IPC-TM-650.

Resistance to copper plating was good when plated with 75 gm/litre copper sulphate with 200 gm/litre sulphuric acid at 30° C.

Resistance to nickel/gold plating was moderate when plated first with nickel from an aqueous solution of 300 gm/litre nickel sulphate, 60 gm/litre nickel metal, 40 gm/litre nickel chloride and 40 gm/litre boric acid at 50° C. It was subsequently plated with gold using 1 troy ounce/gallon potassium gold cyanide at pH 3.5 to 5 and 50° C.

Adhesion was good using ASTM test method D 3359-87.

Alkaline stripping was good using 2.5-5% aqueous sodium hydroxide at 50° C. in an ultrasonic bath.

The invention claimed is:

1. A process for making an electronic device which comprises applying a non-aqueous plate-resistant ink by ink jet printing to selected areas of a dielectric substrate, optionally laminated with an electrically conductive metal(s), exposing the plate resistant ink to actinic and/or particle beam radiation to effect polymerisation, adding one or more metal layers by electrolytic or electroless deposition, the upper layer of which is an etch-resistant metal(s), removing the polymerised plate-resistant ink with alkali and finally removing the electrically conductive metal(s) which are optionally directly laminated to the dielectric substrate and not protected by an upper layer of etch-resistant metal(s) by chemical etching wherein the plate-resistant ink is substantially solvent-free and comprises:
   A) 30 to 90 parts acrylate functional monomers free from acid groups comprising mono- or higher functionality wherein 5 to 95% by weight are mono-functional monomers;
   B) 1 to 30 parts acrylate functional monomer containing one or more acid groups;
   C) 0 to 20 parts polymer or prepolymer;
   D) 0 to 20 parts radical initiator;
   E) 0 to 5 parts colorant;
   F) 0 to 5 parts surfactant; and
where the ink has a viscosity of not greater than 30 cPs (mPa·s) at 40° C. and all parts are by weight.

2. A process as claimed in claim 1 wherein the amount of mono-functional acrylate monomer is not less than 70% by weight of component A).

3. A process as claimed in claim 1 wherein the amount of component B) is 1 to 10 parts by weight.

4. A process as claimed in claim 1 wherein the amount of component B) is not less than 3 parts by weight.

5. A process as claimed in claim 1 wherein component B) is acrylic acid or mono-2-(methacryloyl)ethyl phthalate.

6. A process as claimed in claim 1 wherein the radical initiator is a photo initiator activated by UV light.

7. A process as claimed in claim 1 wherein the ink has a surface tension of from 20 to 40 mN/m.

8. A process as claimed in claim 1 wherein the viscosity of the ink is from 8 to 20 cPs (mPa·s) at 40° C.

9. A process as claimed in claim 1 wherein component B) has an acid value of not less than 100 mg KOH/g.

10. A process as claimed in claim 1 wherein the total etch-resistant ink has an acid value greater than 30 mg KOH/gm.

11. An process as claimed in claim 1 wherein the amount of component C) is zero.

12. A process as claimed in claim 1 wherein the amount of radical initiator is not less than 0.1 parts.

13. A process as claimed in claim 1 wherein the dielectric substrate is laminated with an electrically conductive metal.

14. A process as claimed in claim 13 wherein the electrically conductive metal is copper.

15. A process as claimed in claim 13 wherein the metal layer(s) is deposited by electrolytic deposition.

16. A process as claimed in claim 15 wherein the metal layer(s) is copper, nickel, tin/lead, silver, palladium or gold.

17. A process according to claim 1 wherein the number of parts of components A)+B)+C)+D)+E)+F)=100.

* * * * *